(12) United States Patent
Chen et al.

(10) Patent No.: US 10,958,290 B2
(45) Date of Patent: Mar. 23, 2021

(54) LOCATION OF INTERLEAVER WITH LDPC CODE

(71) Applicant: MediaTek Inc., Hsinchu (TW)

(72) Inventors: Wei-Jen Chen, Hsinchu (TW); Ju-Ya Chen, Hsinchu (TW); Yen-Shuo Chang, Hsinchu (TW); Timothy Perrin Fisher-Jeffes, San Jose, CA (US); Mao-Ching Chiu, Hsinchu (TW); Cheng-Yi Hsu, Hsinchu (TW); Chong-You Lee, Hsinchu (TW)

(73) Assignee: MediaTek Inc.

( * ) Notice: Subject to any disclaimer, the term of this patent is extended or adjusted under 35 U.S.C. 154(b) by 0 days.

(21) Appl. No.: 16/543,783

(22) Filed: Aug. 19, 2019

(65) Prior Publication Data

US 2019/0372600 A1 Dec. 5, 2019

Related U.S. Application Data

(63) Continuation of application No. 15/878,350, filed on Jan. 23, 2018, now Pat. No. 10,432,227.
(Continued)

(51) Int. Cl.
*H03M 13/00* (2006.01)
*H03M 13/27* (2006.01)
(Continued)

(52) U.S. Cl.
CPC ....... *H03M 13/27* (2013.01); *H03M 13/1102* (2013.01); *H03M 13/116* (2013.01);
(Continued)

(58) Field of Classification Search
CPC ............. H03M 13/27; H03M 13/6393; H03M 13/2906; H03M 13/1102
See application file for complete search history.

(56) References Cited

U.S. PATENT DOCUMENTS 9,094,841 B2 7/2015 Sayana et al.
10,164,659 B2 12/2018 Chiu et al.
(Continued)

FOREIGN PATENT DOCUMENTS

CN 101119178 A 2/2008
CN 101951264 A 1/2011
(Continued)

OTHER PUBLICATIONS

China National Intellectual Property Administration, Office Action for China Patent Application No. 201880000471.9, dated Aug. 28, 2019.
(Continued)

*Primary Examiner* — Samir W Rizk
(74) *Attorney, Agent, or Firm* — Han IP PLLC; Andy M. Han

(57) ABSTRACT

Concepts and schemes pertaining to location of interleaver with low-density parity-check (LDPC) code are described. A processor of an apparatus encodes data to provide a stream of encoded data. The processor also rate matches the encoded data to provide a rate-matched stream of encoded data. The processor further interleaving the rate-matched stream of encoded data. In rate matching the encoded data, the processor buffers the stream of encoded data in a circular buffer, with the circular buffer functioning as a rate matching block that rate matches the stream of encoded data. In interleaving the rate-matched stream of encoded data, the processor performs bit-level interleaving on the rate-matched stream of encoded data to provide a stream of interleaved data.

7 Claims, 5 Drawing Sheets

Related U.S. Application Data

(60) Provisional application No. 62/449,677, filed on Jan. 24, 2017, provisional application No. 62/522,149, filed on Jun. 20, 2017.

(51) Int. Cl.
*H03M 13/29* (2006.01)
*H03M 13/11* (2006.01)

(52) U.S. Cl.
CPC ... *H03M 13/2906* (2013.01); *H03M 13/6362* (2013.01); *H03M 13/6393* (2013.01)

(56) References Cited

U.S. PATENT DOCUMENTS

| | | |
|---|---|---|
| 2007/0025548 A1 | 2/2007 | Zheng et al. |
| 2007/0033486 A1 | 2/2007 | Hong et al. |
| 2007/0089027 A1 | 4/2007 | Lim et al. |
| 2008/0320353 A1 | 12/2008 | Blankenship et al. |
| 2012/0047415 A1 | 2/2012 | Djordjevic et al. |
| 2012/0066563 A1 | 3/2012 | Obata et al. |
| 2012/0089890 A1 | 4/2012 | Palanki et al. |
| 2015/0082117 A1 | 3/2015 | Myung et al. |
| 2015/0188734 A1 | 7/2015 | Petrov |
| 2016/0344502 A1 | 11/2016 | Mouhouche et al. |
| 2017/0141789 A1 | 5/2017 | Mikuriya |
| 2017/0141798 A1 | 5/2017 | Kudekar et al. |
| 2018/0139758 A1 | 5/2018 | Sankar et al. |
| 2018/0246783 A1 | 8/2018 | Avraham et al. |

FOREIGN PATENT DOCUMENTS

| | | |
|---|---|---|
| CN | 101984570 A | 3/2011 |
| CN | 104917588 A | 9/2015 |
| CN | 106165303 A | 11/2016 |
| EP | 1701450 A1 | 9/2006 |
| EP | 2938035 A1 | 12/2013 |
| EP | 2879297 A1 | 6/2015 |
| EP | 3264611 A1 | 1/2018 |
| WO | WO 2009028886 A2 | 3/2009 |
| WO | WO 2009094805 A1 | 8/2009 |

OTHER PUBLICATIONS

ZTE, Discussion on channel coding and modulation for new radio interface, 3GPP TSG RAN WG1 #84bix, R1-162229, Busan, Korea, Apr. 11-15, 2016.

European Patent Office, Supplementary European Search Report for European Patent Application No. 18744752.9, dated Feb. 5, 2020.

Nokia et al., Interleaving for LDPC, 3GPP TSG RAN WG1 NR Ad-Hoc#2, R1-1711538, Qingdao, China, Jun. 27-30, 2017.

Mediatek Inc., On design of bit-level interleaver, 3GPP TSG-RAN WG1 Meeting #AH NR, R1-1713710, Prague Czech, Aug. 21-25, 2017.

Samsung, Bit-level interleaver of LDPC codes on high order modulation, 3GPP TSG RAN WG1 #90, R1-1714589, Prage, Czechia, Aug. 21-25, 2017.

Samsung Electronics, pCR 45.820 NB OFDMA—Uplink Forward Error Correction, 3GPP TSG GERAN Adhoc#3, GPC150319, Kista, Sweden, Jun. 29-Jul. 2, 2015.

Taiwan Intellectual Property Office, Office Action for Taiwan Patent Application No. 107102522, dated Oct. 17, 2019.

USPTO, Office Action for U.S. Appl. No. 15/878,357, dated Aug. 19, 2019.

European Patent Office, Extended European Search Report for European Patent Application No. 18736710.7, dated Jan. 7, 2020.

3GPP, 3rd Generation Partnership Project, Technical Specification Group Radio Access Network; NR; Multiplexing and channel coding (Release 15), 3GPP TS 38.212, 3GPP, Mobile Competence Centre, 650 Route Des Lucioles, F-06921 Sophia-Antipolis Cedex, France, vol. RAN WG1, V0.0.1, Aug. 12, 2017, pp. 1-23.

Ericsson, LDPC Code Design for NR, 3GPP Draft, R1-1608875, 3GPP, Mobile Competence Centre, 650 Route Des Lucioles, F-06921 Sophia-Antipolis Cedex, France, vol. RAN WG1, Lisbon, Portugal, Oct. 10-14, 2016.

IEEE, Standard for Local and metropolitan area networks Part 16: Air Interface for Broadband Wireless Access Systems; IEEE Std 802.16-2009 (Revision of IEEE Std 802.16-2004), IEEE Standard, IEEE, Piscataway, NJ, USA, May 29, 2009.

Taiwan Intellectual Property Office, Office Action for Taiwan Patent Application No. 107118939, dated Dec. 11, 2019.

European Patent Office, Communication regarding European Patent Application No. 17170825.8, dated Apr. 28, 2020.

Toshihiko Okamura, A Hybrid ARQ Scheme Based on Shortened Low-Density Parity-Check Codes, Wireless Communications and Networking Conference, Mar. 31, 2008, pp. 82-87, XP031243605, ISBN: 978-1-4244-1997-5, WCNC, Piscataway, NJ, USA.

Jong-Ee Oh et al., Row-Splitting Design of Low-Density Parity-Check Codes for Gbps Transmission, Vehicular Technology Conference, Sep. 1, 2007, pp. 1127-1131, XP031147582, ISBN: 978-1-4244-0263-2.

Nokia et al., LDPC Design for eMBB, 3GPP TSG-RAN WG1 #86, R1-167273, pp. 20160822-20160826, Gothenburg, Sweden, Aug. 12, 2016.

European Patent Office, Extended European Search Report for European Patent Application No. 18744192.8, dated Feb. 13, 2020.

Mediatek Inc., On Design of Bit-Level Interleaver, 3GPP TSG-RAN WG1 Meeting AH NR#3, R1-1716738, Nagoya, Japan, Sep. 18-21, 2017.

ETSI, Digital Video Broadcasting (DVB); Second generation framing structure, channel coding and modulation system for Broadcasting, Interactive Services, News Gathering and other broadband satellite applications (DVB-S2), Europea Standard (Telecommunications series), ETSI EN 302 307 V1.3.1, Jul. 2012.

Samsung, Text proposal for SMP (Symbol Mapping based on bit Priority), TSG-RAN WG1 #23, R1-02-0024, Espoo, Finland, Jan. 8-11, 2002.

USPTO, Office Action for U.S. Appl. No. 15/995,093, dated Sep. 17, 2019.

Mediatek Inc., Multi-codebook embedded compact QC-LDPC design, 3GPP TSG-RAN WG1 NR, Spokane, U.S.A., Aug. 3-7, 2017.

China Natinoal Intellectual Property Administration, Office Action for China Patent Application No. 2018800004719, dated Mar. 2, 2020.

European Patent Office, Communication regarding European Patent Application No. 18809835.4, dated Jul. 15, 2020.

Mediatek Inc., On design and performance of NR eMBB LDPC Code, 3GPP TSG-RAN WG1 Meeting #89, R1-1707850, Hangzhou, China, May 15-19, 2017.

Mediatek Inc., On design and performance of NR eMBB LDPC Code, 3GPP TSG-RAN WG1 Meeting #89, R1-1709856, Hangzhou, China, May 15-19, 2017.

European Patent Office, Summons to attend oral proceedings pursuant to Rule 115(1) EPC regarding European Patent Application No. 17170825.8, Nov. 23, 2020.

Hui Wang et al., On the LLR criterion based shortening design for LDPC codes, 2016 Annual Conference on Information Science and Systems (CISS), IEEE, Mar. 16, 2016, pp. 87-92, XP032895850.

China National Intellectual Property Administration, Office Action for China Patent Application No. 201880001782.7, dated Nov. 27, 2020.

LOCATION OF INTERLEAVER WITH LDPC CODE

CROSS REFERENCE TO RELATED PATENT APPLICATIONS

The present disclosure is part of a continuation of U.S. patent application Ser. No. 15/878,350, filed 23 Jan. 2018, which claims the priority benefit of U.S. Provisional Patent Application Ser. Nos. 62/449,677 and 62/522,149, filed 24 Jan. 2017 and 20 Jun. 2017, respectively. Contents of aforementioned applications are herein incorporated by reference in their entirety.

TECHNICAL FIELD

The present disclosure is generally related to information coding and, more particularly, to location of interleaver with low-density parity-check (LDPC) code.

BACKGROUND

Unless otherwise indicated herein, approaches described in this section are not prior art to the claims listed below and are not admitted as prior art by inclusion in this section.

In $5^{th}$-generation (5G) New Radio (NR) mobile communications, LDPC is used in NR data channel. In general, LDPC is composed of base matrix and shift-coefficient tables. However, the location of interleaver with LDPC code is not defined.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose various novel concepts and schemes pertaining to the location of interleaver with LDPC code. In particular, potential locations of a bit-level interleaver relative to a circular buffer are proposed in the present disclosure. Under a first proposed scheme, the location of a bit-level interleaver may be before a circular buffer. Under a second proposed scheme, the location of a bit-level interleaver may be after a circular buffer.

In one aspect, a method may involve rate matching a stream of encoded data. The method may also involve passing the stream of encoded data through a bit-level interleaver to provide a stream of interleaved data.

In one aspect, a method may involve passing a stream of encoded data through a bit-level interleaver to provide a stream of interleaved data. The method may also involve rate matching the stream of interleaved data.

In one aspect, an apparatus may include a transceiver and a processor coupled to the transceiver. The transceiver may be capable of wireless communications with at least one network node of a wireless network. The processor may be capable of encoding data to provide a stream of encoded data. The processor may be also capable of performing rate matching and interleaving on the encoded data.

It is noteworthy that, although description of the proposed scheme and various examples is provided below in the context of 5G NR wireless communications, the proposed concepts, schemes and any variation(s)/derivative(s) thereof may be implemented in communications in accordance with other protocols, standards and specifications where implementation is suitable. Thus, the scope of the proposed scheme is not limited to the description provided herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Under the first proposed scheme, the location of a bit-level interleaver may be before a circular buffer. The circular buffer may be equivalent to a rate matching block. Accordingly, data input to the circular buffer may be interleaved. As such, the interleaved data in the circular buffer may be with a lowest code rate, and rate matching may be performed to pass through code block concatenation. At a receiver, a LDPC decoder may utilize the lowest code rate to decode a received codeword. Higher complexity is for the decoder with lower code rate. The first proposed scheme may introduce relatively more decoder complexity to the receiver.

Under the second proposed scheme, the location of a bit-level interleaver may be after a circular buffer. The circular buffer may be equivalent to a rate matching block. Accordingly, data may be rate matched and then passed through the bit-level interleaver. Since the data is rate matched with a suitable code rate, a decoder at a receiver may utilize the corresponding code rate to decode received data. Therefore, complexity of the decoder in the second proposed scheme may be lower than that of the decoder in the first proposed scheme. From the perspective of decoder complexity, the second proposed scheme may be preferred for interleaver.

Figure 1:
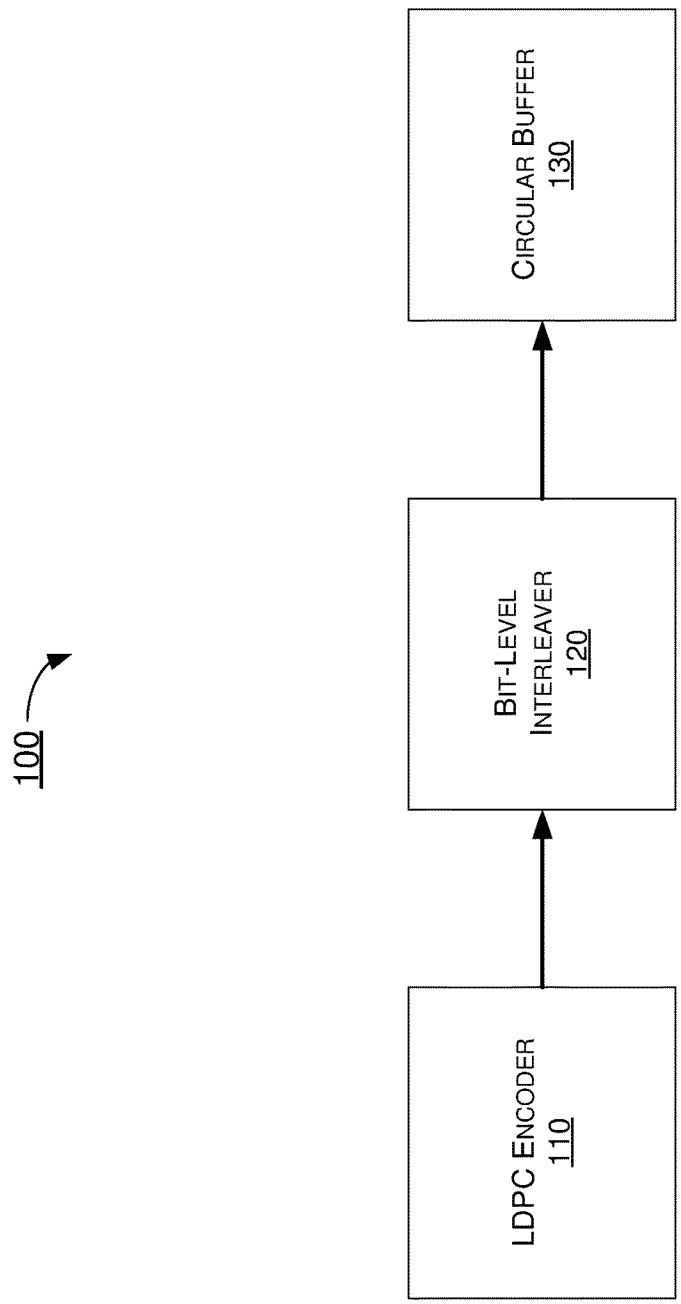
FIG. 1 illustrates an example encoder architecture in accordance with an implementation of the present disclosure.

FIG. 1 illustrates an example encoder architecture 100 in accordance with an implementation of the present disclosure. Encoder architecture 100 may be an architecture based on the first proposed scheme. Referring to FIG. 1, encoder architecture 100 may include a LDPC encoder 110, a bit-level interleaver 120 and a circular buffer 130.

LDPC encoder 110 may be configured, designed or otherwise adapted to perform LDPC encoding on input data to provide a stream of encoded data. Bit-level interleaver 120 may be configured, designed or otherwise adapted to receive the stream of encoded data from LDPC encoder 110 and perform bit-level interleaving on the encoded data to provide a stream of interleaved data (e.g., including systematic bits, information bits and parity bits). Circular buffer 130 may be configured, designed or otherwise adapted to receive the stream of interleaved data from bit-level interleaver 120 and buffer the stream of interleaved data.

With encoder architecture 100, the interleaved data in circular buffer 130 may be with a lowest code rate, and rate matching may be performed to pass through code block concatenation. At a receiver, a LDPC decoder may utilize the lowest code rate to decode a received codeword. Given the nature of LDPC coding, the lower the code rate used on the encoder side, the higher the complexity in decoding becomes on the decoder side. Thus, the design may result in higher complexity for the decoder when a relatively lower code rate is used on the encoder side.

Figure 2:
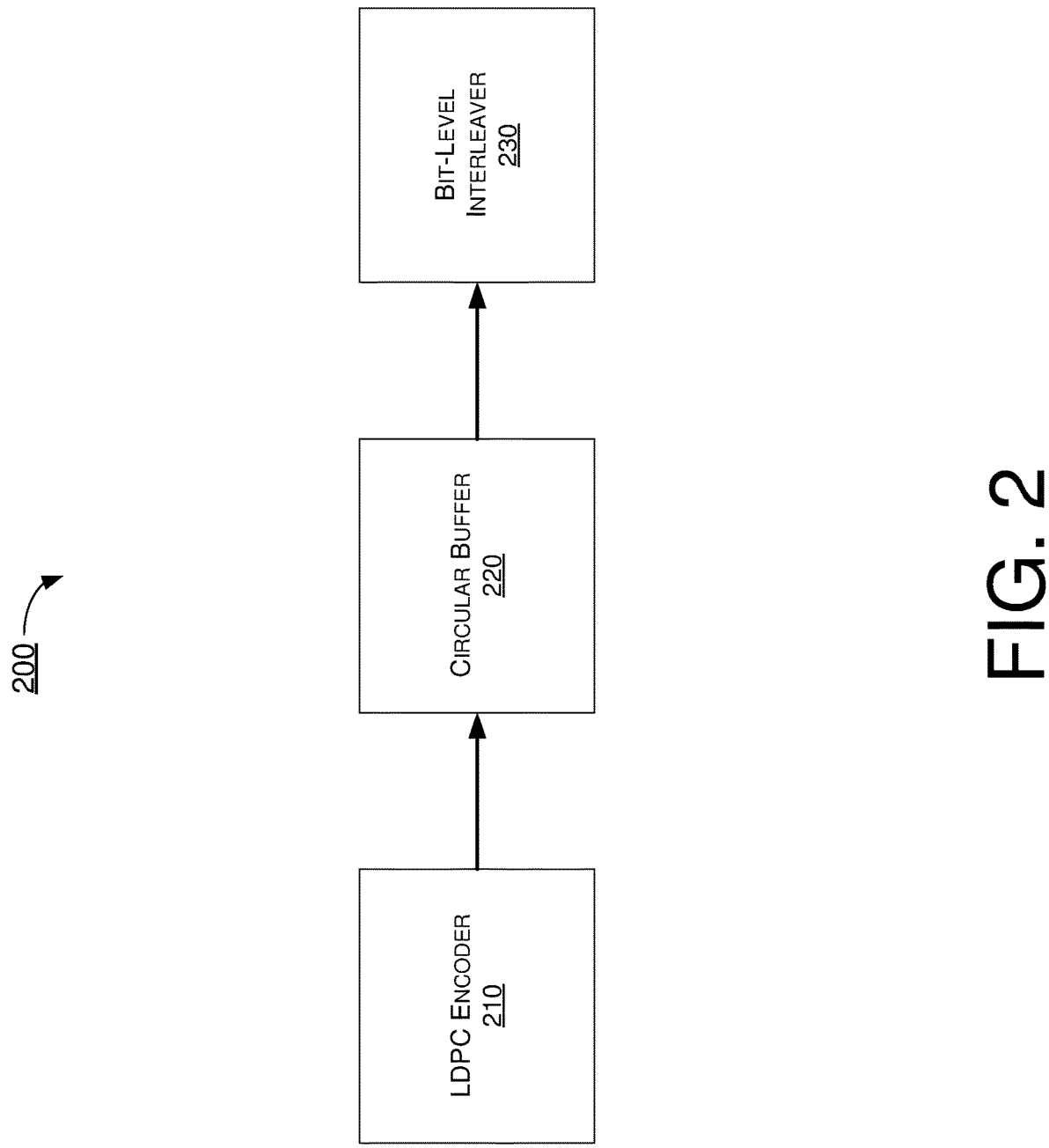
FIG. 2 illustrates an example encoder architecture in accordance with another implementation of the present disclosure.

FIG. 2 illustrates an example encoder architecture 200 in accordance with an implementation of the present disclosure. Encoder architecture 200 may be an architecture based on the second proposed scheme. Referring to FIG. 2, encoder architecture 200 may include a LDPC encoder 210, a circular buffer 220 and a bit-level interleaver 230.

LDPC encoder 210 may be configured, designed or otherwise adapted to perform LDPC encoding on input data to provide a stream of encoded data. Circular buffer 220 may be configured, designed or otherwise adapted to receive the stream of encoded data from LDPC encoder 210 and buffer the stream of encoded data. Bit-level interleaver 230 may be configured, designed or otherwise adapted to receive the stream of encoded data from circular buffer 220 and perform bit-level interleaving on the encoded data to provide a stream of interleaved data (e.g., including systematic bits, information bits and parity bits). Accordingly, data may be rate matched and then passed through bit-level interleaver 230. Since the data may be rate matched with a suitable code rate (e.g., a relatively higher code rate), a decoder at a receiver may utilize the corresponding code rate to decode received data. Advantageously, complexity of the decoder with encoder architecture 200 may be lower than that of the decoder with encoder architecture 100.

Illustrative Implementations

Figure 3:
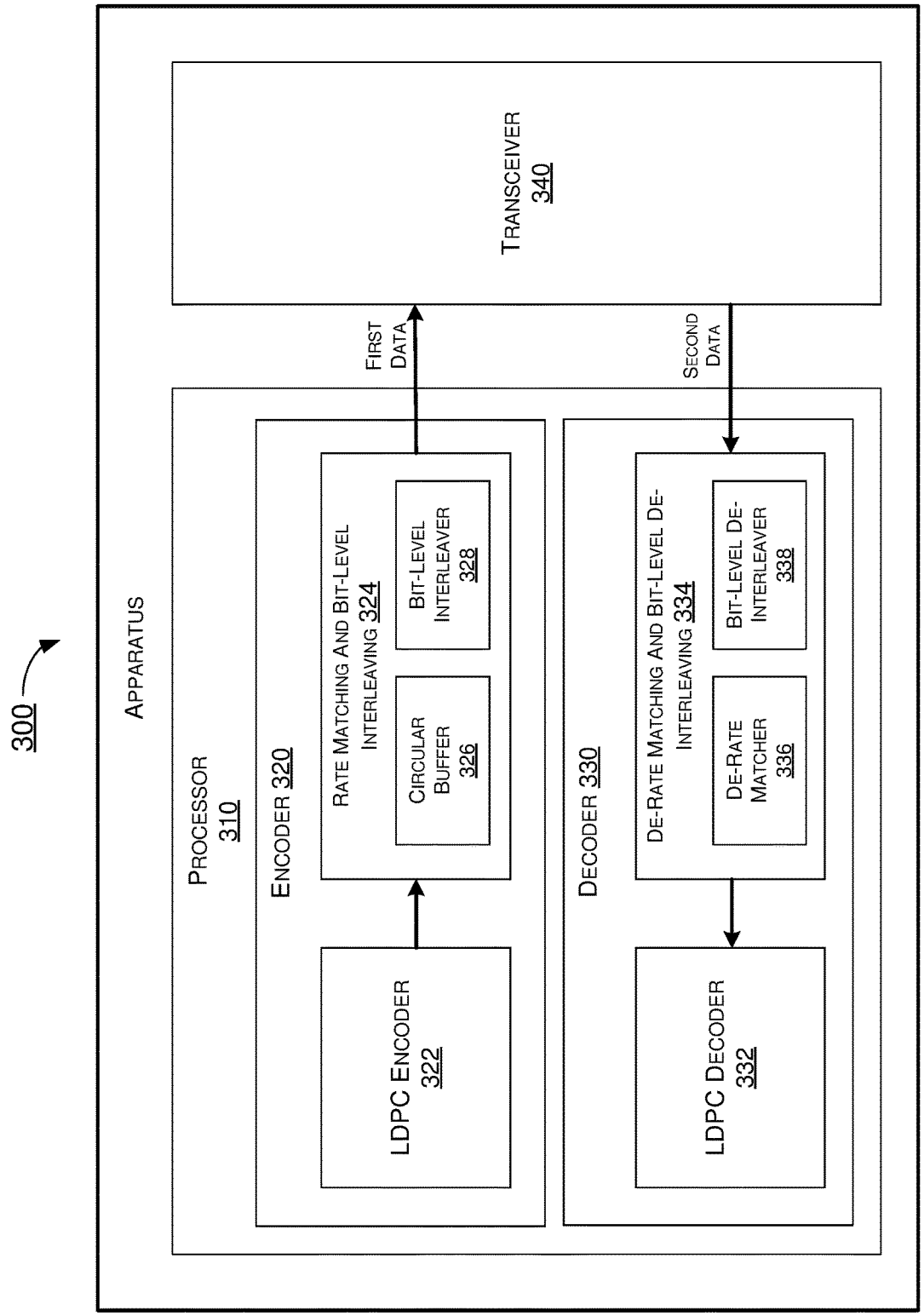
FIG. 3 is a block diagram of an example apparatus in accordance with an implementation of the present disclosure.

FIG. 3 illustrates an example apparatus 300 in accordance with an implementation of the present disclosure. Apparatus 300 may perform various functions as a communication device to implement concepts, schemes, techniques, processes and methods described herein pertaining to location of interleaver with LDPC code, including those described above with respect to FIG. 1 and FIG. 2 as well as processes 400 and 500 described below.

Apparatus 300 may be a part of an electronic apparatus which may be a communication device, a computing apparatus, a portable or mobile apparatus, or a wearable apparatus. For instance, apparatus 300 may be implemented in a user equipment, a base station, a smartphone, a smartwatch, a smart bracelet, a smart necklace, a personal digital assistant, or a computing device such as a tablet computer, a laptop computer, a notebook computer, a desktop computer, or a server. Alternatively, apparatus 300 may be implemented in the form of one or more integrated-circuit (IC) chips such as, for example and not limited to, one or more single-core processors, one or more multi-core processors, or one or more complex-instruction-set-computing (CISC) processors.

Apparatus 300 may include at least some of those components shown in FIG. 3. For instance, apparatus 300 may include at least a processor 310. Additionally, apparatus 300 may include a transceiver 340 configured to engage in wireless communications by transmitting and receiving data wirelessly with at least one network node of a wireless network (e.g., in compliance with one or more 3GPP and 5G NR stands, protocols, specifications and/or any applicable wireless protocols and standards). Apparatus 300 may further include other components (e.g., memory, power system, display device and user interface device), which are not pertinent to the proposed scheme of the present disclosure and, thus, are neither shown in FIG. 3 nor described herein in the interest of simplicity and brevity.

In one aspect, processor 310 may be implemented in the form of one or more single-core processors, one or more multi-core processors, or one or more CISC processors. That is, even though a singular term "a processor" is used herein to refer to processor 310, processor 310 may include multiple processors in some implementations and a single processor in other implementations in accordance with the present disclosure. In another aspect, processor 310 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, processor 310 is a special-purpose machine specifically designed, arranged and configured to perform specific tasks including location of interleaver with LDPC code in accordance with various implementations of the present disclosure.

Processor 310, as a special-purpose machine, may include non-generic and specially-designed hardware circuits that are designed, arranged and configured to perform specific tasks pertaining to location of interleaver with LDPC code in accordance with various implementations of the present disclosure. In one aspect, processor 310 may execute the one or more sets of codes, programs and/or instructions (e.g., stored in memory accessible by processor 310) to perform various operations to render location of interleaver with LDPC code in accordance with various implementations of the present disclosure. In another aspect, processor 310 may include an encoder 320 and a decoder 330 that, together, perform specific tasks and functions to render location of interleaver with LDPC code in accordance with various implementations of the present disclosure. In some implementations, encoder architecture 100 and its functionality and capabilities described above may be implemented in or by encoder 320. Alternatively, or additionally, encoder architecture 200 and its functionality and capabilities described above may be implemented in or by encoder 320. Each of encoder 320 and decoder 330 may be implemented in the form of hardware with electronic circuitry. Alternatively, each of encoder 320 and decoder 330 may be implemented in the form of software. Still alternatively, each of encoder 320 and decoder 330 may be implemented in the form of a combination of hardware and software.

In some implementations, encoder 320 may include a LDPC encoder 322 and a rate matching and bit-level interleaving block 324, and encoder 320 may be capable of encoding outgoing data to provide first data which is encoded data. For instance, LDPC encoder 322 may encode outgoing data to provide a stream of encoded data. Moreover, rate matching and bit-level interleaving block 324 may perform rate matching and interleaving on the encoded data to provide first data for transmission by transceiver 340. In some implementations, In some implementations, in encoding the data to provide the stream of encoded data, LDPC encoder 322 of encoder 320 of processor 310 may perform LDPC encoding on the data to provide the stream of encoded data.

In some implementations, in performing rate matching and interleaving on the encoded data, rate matching and bit-level interleaving block 324 of encoder 320 of processor 310 may rate match the stream of encoded data. Moreover, rate matching and bit-level interleaving block 324 may interleave the rate-matched stream of encoded data to provide a stream of interleaved data.

In some implementations, in rate matching the stream of encoded data, circular buffer 326 of rate matching and bit-level interleaving block 324 of encoder 320 of processor 310 may buffer the stream of encoded data, with circular buffer 326 functioning as a rate matching block that rate matches the stream of encoded data.

In some implementations, circular buffer rate 326 may match the stream of encoded data with a code rate that is used by a decoder at a receiver to decode data received by the receiver.

In some implementations, in interleaving the rate-matched stream of encoded data, rate matching and bit-level interleaving block 324 of encoder 320 of processor 310 may perform bit-level interleaving on the rate-matched stream of encoded data to provide the stream of interleaved data.

In some implementations, in performing rate matching and interleaving on the encoded data, rate matching and bit-level interleaving block 324 may interleave the stream of encoded data to provide a stream of interleaved data. Moreover, rate matching and bit-level interleaving block 324 may rate match the stream of interleaved data to provide a rate-matched stream of interleaved data.

In some implementations, in interleaving the stream of encoded data, bit-level interleaver 328 of rate matching and bit-level interleaving block 324 may perform bit-level interleaving on the stream of encoded data to provide the stream of interleaved data.

In some implementations, in rate matching the stream of interleaved data, circular buffer 326 may buffer the stream of interleaved data, with circular buffer 326 functioning as a rate matching block that rate matches the stream of interleaved data.

In some implementations, circular buffer 326 may rate match the stream of interleaved data with a code rate that is used by a decoder at a receiver to decode data received by the receiver.

In some implementations, decoder 330 may include a LDPC decoder 332 and a de-rate matching and bit-level de-interleaving block 334, and decoder 330 may be capable of decoding second data, which is encoded data received from transceiver 340, to provide decoded data. For instance, de-rate matching and bit-level de-interleaving block 334 may process the second data to provide processed data. Moreover, LDPC decoder 332 may decode the processed data with LDPC code to provide the decoded data. In some implementations, de-rate matching and bit-level de-interleaving block 334 may include a de-rate matcher 336 and a bit-level de-interleaver 338. Bit-level de-interleaver 338 may perform bit-level de-interleaving on the second data to provide a stream of de-interleaved data. De-rate matcher 336 may de-rate match the stream of de-interleaved data to provide the processed data for LDPC decoder 332 to decode.

Illustrative Processes

Figure 4:
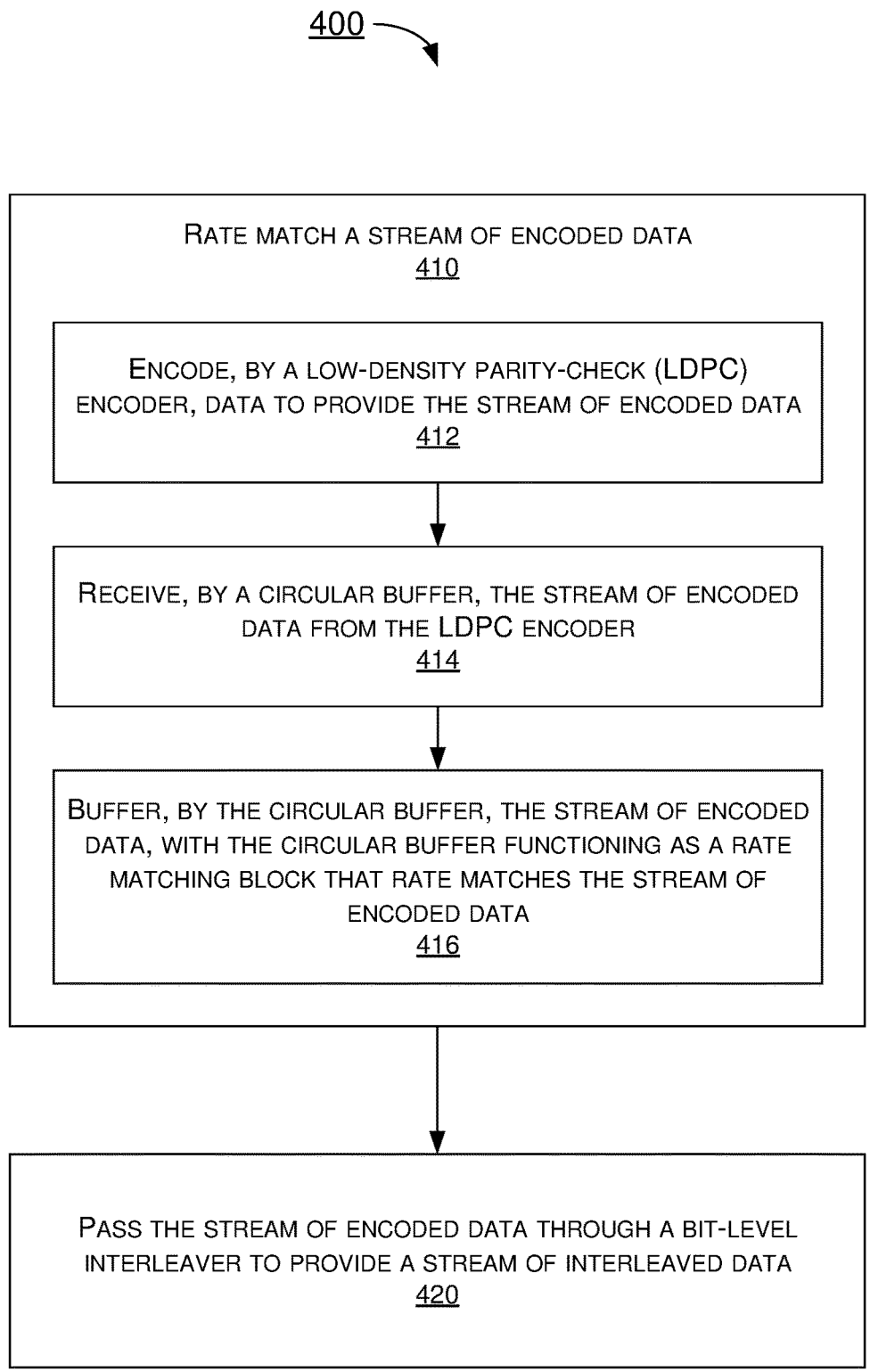
FIG. 4 is a flowchart of an example process in accordance with an implementation of the present disclosure.

FIG. 4 illustrates an example process 400 in accordance with an implementation of the present disclosure. Process 400 may represent an aspect of implementing the proposed concepts and schemes such as those described with respect to FIG. 2. More specifically, process 400 may represent an aspect of the proposed concepts and schemes pertaining to location of interleaver with LDPC code. Process 400 may include one or more operations, actions, or functions as illustrated by one or more of blocks 410 and 420 as well as sub-blocks 412, 414 and 416. Although illustrated as discrete blocks, various blocks of process 400 may be divided into additional blocks, combined into fewer blocks, or eliminated, depending on the desired implementation. Moreover, the blocks/sub-blocks of process 400 may be executed in the order shown in FIG. 4 or, alternatively in a different order. Process 400 may be implemented by apparatus 300 and any variations thereof. For instance, process 400 may be implemented in or by apparatus 300. Solely for illustrative purposes and without limiting the scope, process 400 is described below in the context of apparatus 300. Process 400 may begin at block 410.

At 410, process 400 may involve encoder 320 of processor 310 of apparatus 300 rate matching a stream of encoded data. Process 400 may proceed from 410 to 420.

At 420, process 400 may involve encoder 320 of processor 310 passing the stream of encoded data through a bit-level interleaver to provide a stream of interleaved data.

With respect to rate matching a stream of encoded data, process 400 may involve processor 310 performing certain operations as represented by sub-blocks 412, 414 and 416.

At 412, process 400 may involve LDPC encoder 322 of encoder 320 of processor 310 encoding data to provide the stream of encoded data. Process 400 may proceed from 412 to 414.

At 414, process 400 may involve circular buffer 326 of rate matching and bit-level interleaving block 324 of encoder 320 of processor 310 receiving the stream of encoded data from LDPC encoder 322. Process 400 may proceed from 414 to 416.

At 416, process 400 may involve circular buffer 326 of rate matching and bit-level interleaving block 324 of encoder 320 of processor 310 buffering the stream of encoded data.

In some implementations, circular buffer 326 may function as a rate matching block that rate matches the stream of encoded data.

In some implementations, circular buffer 326 may rate matches the stream of encoded data with a code rate that is used by a decoder at a receiver to decode data received by the receiver.

In some implementations, in passing the stream of encoded data through the bit-level interleaver, process 400 may involve bit-level interleaver 328 of rate matching and bit-level interleaving block 324 of encoder 320 of processor 310 receiving the stream of encoded data from circular buffer 326. Moreover, process 400 may involve bit-level interleaver 328 performing bit-level interleaving on the stream of encoded data to provide the stream of interleaved data.

Figure 5:
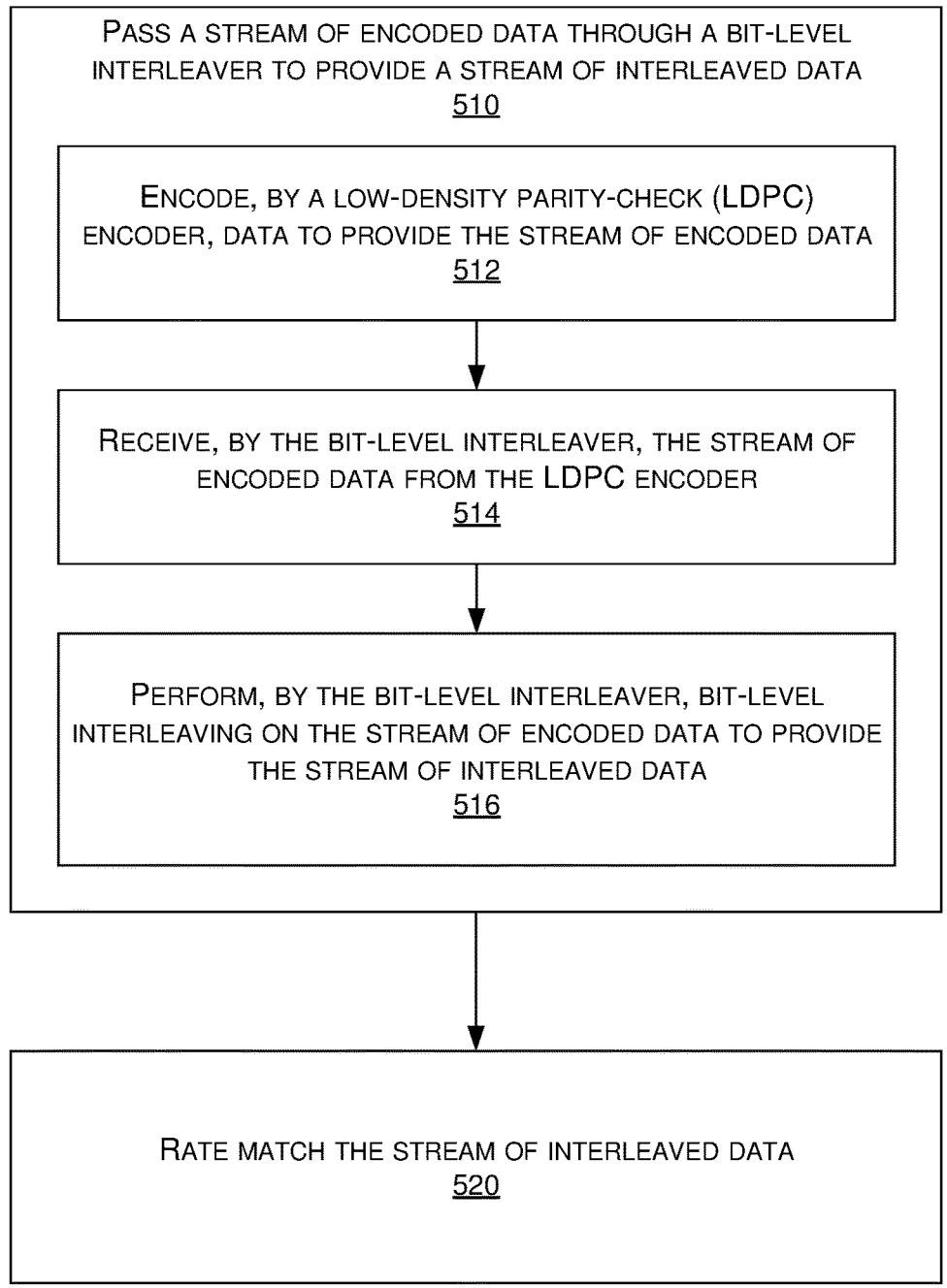
FIG. 5 is a flowchart of an example process in accordance with an implementation of the present disclosure.

FIG. 5 illustrates an example process 500 in accordance with an implementation of the present disclosure. Process 500 may represent an aspect of implementing the proposed concepts and schemes such as those described with respect to FIG. 1. More specifically, process 500 may represent an aspect of the proposed concepts and schemes pertaining to location of interleaver with LDPC code. Process 500 may include one or more operations, actions, or functions as illustrated by one or more of blocks 510 and 520 as well as sub-blocks 512, 514 and 516. Although illustrated as discrete blocks, various blocks of process 500 may be divided into additional blocks, combined into fewer blocks, or eliminated, depending on the desired implementation. Moreover, the blocks/sub-blocks of process 500 may be executed in the order shown in FIG. 5 or, alternatively in a different order. Process 500 may be implemented by apparatus 300 and any variations thereof. For instance, process 500 may be implemented in or by apparatus 300. Solely for illustrative purposes and without limiting the scope, process 500 is described below in the context of apparatus 300. Process 500 may begin at block 510.

At 510, process 500 may involve encoder 320 of processor 310 of apparatus 300 passing a stream of encoded data through a bit-level interleaver to provide a stream of interleaved data. Process 500 may proceed from 510 to 520.

At 520, process 500 may involve encoder 320 of processor 310 rate matching the stream of interleaved data.

With respect to passing a stream of encoded data through a bit-level interleaver, process 500 may involve processor 310 performing certain operations as represented by sub-blocks 512, 514 and 516.

At 512, process 500 may involve LDPC encoder 322 of encoder 320 of processor 310 encoding data to provide the stream of encoded data. Process 500 may proceed from 512 to 514.

At 514, process 500 may involve bit-level interleaver 328 of rate matching and bit-level interleaving block 324 of encoder 320 of processor 310 receiving the stream of encoded data from LDPC encoder 322. Process 500 may proceed from 514 to 516.

At 516, process 500 may involve bit-level interleaver 328 performing bit-level interleaving on the stream of encoded data to provide the stream of interleaved data.

In some implementations, in rate matching the stream of interleaved data, process 500 may involve circular buffer 326 of rate matching and bit-level interleaving block 324 of encoder 320 of processor 310 receiving the stream of interleaved data from bit-level interleaver 328. Moreover, process 500 may involve circular buffer 326 buffering the stream of interleaved data.

In some implementations, circular buffer 326 may function as a rate matching block that rate matches the stream of interleaved data.

In some implementations, circular buffer 326 may rate match the stream of interleaved data with a code rate that is used by a decoder at a receiver to decode data received by the receiver.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
    passing, by a decoder circuit of a processor of an apparatus, a stream of interleaved data through a bit-level de-interleaver of the decoder circuit to provide a stream of de-interleaved data; and
    de-rate matching, by a de-rate matcher of the decoder circuit of the processor, the stream of de-interleaved data to provide a stream of de-rate matched data,
    wherein the stream of interleaved data is interleaved by first passing through a circular buffer and then being interleaved by a bit-level interleaver on an encoder such that a complexity of the decoder circuit is lower than a case in which the stream of interleaved data is interleaved by first being interleaved by the bit-level interleaver and then passing through circular buffer.

2. The method of claim 1, further comprising:
    decoding, by a decoder of the decoder circuit, the stream of de-rate matched data to provide a stream of decoded data.

3. The method of claim 2, wherein the decoding of the stream of de-rate matched data comprises performing low-density parity-check (LDPC) decoding on the stream of de-rate matched data.

4. The method of claim 1, further comprising:
    wirelessly receiving, by a transceiver of the apparatus, the stream of interleaved data from a network node of a wireless network.

5. An apparatus, comprising:
    a transceiver configured to wirelessly receive a stream of interleaved data from a network node of a wireless network; and
    a processor coupled to the transceiver, the processor comprising a decoder circuit that is configured to perform operations comprising:
        passing, by the decoder circuit of the processor, the stream of interleaved data through a bit-level de-interleaver of the decoder circuit to provide a stream of de-interleaved data; and
        de-rate matching, by a de-rate matcher of the decoder circuit, the stream of de-interleaved data to provide a stream of de-rate matched data,
    wherein the stream of interleaved data is interleaved by first passing through a circular buffer and then being interleaved by a bit-level interleaver on an encoder such that a complexity of the decoder circuit is lower than a case in which the stream of interleaved data is interleaved by first being interleaved by the bit-level interleaver and then passing through circular buffer.

6. The apparatus of claim 5, wherein the processor is further configured to perform operations comprising:
    decoding, by a decoder of the decoder circuit, the stream of de-rate matched data to provide a stream of decoded data.

7. The apparatus of claim 6, wherein the decoder comprises a low-density parity-check (LDPC) decoder.

* * * * *